(12) United States Patent
Matsushima et al.

(10) Patent No.: US 12,183,792 B2
(45) Date of Patent: Dec. 31, 2024

(54) SIC COMPOSITE SUBSTRATE AND COMPOSITE SUBSTRATE FOR SEMICONDUCTOR DEVICE

(71) Applicant: NGK INSULATORS, LTD., Nagoya (JP)

(72) Inventors: Kiyoshi Matsushima, Nagoya (JP); Jun Yoshikawa, Nagoya (JP); Morimichi Watanabe, Nagoya (JP); Risa Miyakaze, Nagoya (JP)

(73) Assignee: NGK INSULATORS, LTD., Nagoya (JP)

( * ) Notice: Subject to any disclaimer, the term of this patent is extended or adjusted under 35 U.S.C. 154(b) by 464 days.

(21) Appl. No.: 17/445,617

(22) Filed: Aug. 23, 2021

(65) Prior Publication Data
US 2021/0384300 A1    Dec. 9, 2021

Related U.S. Application Data

(63) Continuation of application No. PCT/JP2020/004321, filed on Feb. 5, 2020.

(30) Foreign Application Priority Data

Mar. 27, 2019  (JP) ................................ 2019-061503

(51) Int. Cl.
*H01L 29/16* (2006.01)
*C30B 29/36* (2006.01)
*H01L 21/02* (2006.01)

(52) U.S. Cl.
CPC .......... *H01L 29/1608* (2013.01); *C30B 29/36* (2013.01); *H01L 21/02378* (2013.01); *H01L 21/02595* (2013.01)

(58) Field of Classification Search
CPC ..... C01B 32/956–984; H01L 21/02378; H01L 29/1608; H01L 29/1604;
(Continued)

(56) References Cited

U.S. PATENT DOCUMENTS 6,053,973 A  *  4/2000  Tanino .................... C30B 29/36
                                                                    117/9
9,627,568 B2      4/2017  Ichimura et al.
(Continued)

FOREIGN PATENT DOCUMENTS

JP    H11-147794 A    6/1999
JP    2961522 B2    10/1999
(Continued)

OTHER PUBLICATIONS

International Search Report and Written Opinion (Application No. PCT/JP2020/004321) dated May 12, 2020 (with English translation).

*Primary Examiner* — Evren Seven
*Assistant Examiner* — Cole Leon Lindsey
(74) *Attorney, Agent, or Firm* — BURR PATENT LAW, PLLC (57) ABSTRACT

Provided is a SiC composite substrate including a biaxially-oriented SiC layer in which SiC is oriented in both a c-axis direction and an a-axis direction, and a SiC polycrystalline layer provided on one surface of the biaxially-oriented SiC layer. A joint interface of the biaxially-oriented SiC layer and the SiC polycrystalline layer has an uneven shape, which has an amount of unevenness of 1 to 200 μm.

6 Claims, 3 Drawing Sheets

(58) Field of Classification Search
CPC ....... H01L 29/161–167; H01L 21/0445–0495; H01L 29/66053–66068
See application file for complete search history.

(56) References Cited

U.S. PATENT DOCUMENTS

| | | |
|---|---|---|
| 10,625,371 B2 | 4/2020 | Hirata et al. |
| 10,680,068 B2 | 6/2020 | Imaoka et al. |
| 2018/0251911 A1* | 9/2018 | Kubota ............. H01L 21/02513 |
| 2019/0296125 A1* | 9/2019 | Schulze ............ H01L 21/02447 |

FOREIGN PATENT DOCUMENTS

| | | |
|---|---|---|
| JP | 2000-001399 A | 1/2000 |
| JP | 2000-053500 A | 2/2000 |
| JP | 2004-323293 A | 11/2004 |
| JP | 2012-153543 A | 8/2012 |
| JP | 2017-059574 A | 3/2017 |
| JP | 2018-014372 A | 1/2018 |
| JP | 6429715 B2 | 11/2018 |
| WO | 2014/185339 A1 | 11/2014 |

* cited by examiner

SIC COMPOSITE SUBSTRATE AND COMPOSITE SUBSTRATE FOR SEMICONDUCTOR DEVICE

CROSS-REFERENCE TO RELATED APPLICATIONS

This application is a continuation application of PCT/JP2020/004321 filed Feb. 5, 2020, which claims priority to Japanese Patent Application No. 2019-061503 filed Mar. 27, 2019, the entire contents all of which are incorporated herein by reference.

BACKGROUND OF THE INVENTION

1. Field of the Invention

The present invention relates to a SiC composite substrate and a composite substrate for a semiconductor device.

2. Description of the Related Art

Heretofore, SiC (silicon carbide) has attracted attention as a wide bandgap material which can control large voltage and large electric power with low loss. In particular, in recent years, a power semiconductor device using a SiC material (SiC power device) has more excellent downsizing, low power consumption, and high efficiency than those of a power semiconductor device using a Si semiconductor, whereby the use of the power semiconductor device using the SiC material in various applications is expected. For example, by employing the SiC power device, a converter, an inverter, an on-board battery charger and the like for electric vehicles (EV) and plug-in hybrid electric vehicles (PHEV) can be downsized to provide improved efficiency.

Meanwhile, a SiC substrate is very expensive compared with a Si substrate. Then, a composite substrate has been proposed, which is obtained by combining a thin single-crystalline SiC substrate with an inexpensive polycrystalline SiC substrate. For example, Patent Literature 1 (JP2961522B) discloses a substrate for a semiconductor electronic device obtained by integrally joining a thin SiC single-crystalline wafer and a base substrate part to each other with an oxidation layer interposed therebetween. As described in Patent Literature 1, a SiC polycrystalline substrate part is preferably used as the base substrate part from the viewpoint of an improvement in a heat dissipation property. In the literature, the SiC single-crystalline wafer and the base substrate part are integrally joined to each other at room temperature in a state where the oxidation layer is interposed therebetween. Patent Literature 2 (JP2018-014372A) discloses a semiconductor substrate obtained by joining a single-crystalline SiC substrate and a polycrystalline SiC support substrate to each other. The single-crystalline SiC substrate and the polycrystalline SiC substrate are joined to each other by irradiating the substrates with a neutral atomic beam of argon to activate the substrates, and bringing surfaces of the substrates into contact with each other in a vacuum.

CITATION LIST

Patent Literature

Patent Literature 1: JP2961522B
Patent Literature 2: JP2018-014372A
Patent Literature 3: JP6429715B

SUMMARY OF THE INVENTION

However, as described in Patent Literatures 1 and 2, in the conventional SiC composite substrate obtained by joining the SiC single-crystalline substrate and the SiC polycrystalline substrate to each other, detachment of a joined surface (delamination), breaking and cracking may occur under the influence of a residual stress caused by the polishing of the surface of the single-crystalline SiC substrate.

The present inventors have now found that in a SiC composite substrate including a biaxially-oriented SiC layer and a SiC polycrystalline layer, a joint interface of the layers having a predetermined irregular shape makes it possible to have the SiC composite substrate less likely to cause delamination, breaking and cracking, even if subjected to machining such as grinding and polishing.

Therefore, it is an object of the present invention to provide a SiC composite substrate that is less likely to cause delamination, breaking and cracking, even if subjected to machining such as grinding and polishing.

According to an aspect of the present invention, there is provided a SiC composite substrate comprising:
 a biaxially-oriented SiC layer in which SiC is oriented in both a c-axis direction and an a-axis direction; and
 a SiC polycrystalline layer provided on one surface of the biaxially-oriented SiC layer,
 wherein a joint interface of the biaxially-oriented SiC layer and the SiC polycrystalline layer has an uneven shape, which has an amount of unevenness of 1 to 200 μm.

According to an aspect of the present invention, there is provided a composite substrate for a semiconductor device comprising:
 the SIC composite substrate; and
 a functional layer for a semiconductor device provided on the biaxially-oriented SiC layer of the SiC composite substrate.

DETAILED DESCRIPTION OF THE INVENTION

SiC Composite Substrate

Figure 1:
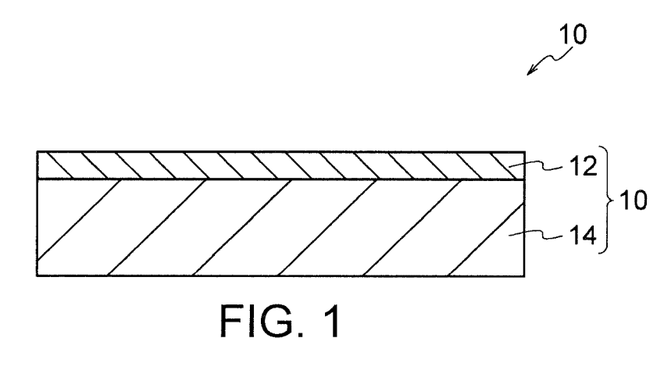
FIG. 1 is a schematic cross-sectional view showing an example of a SiC composite substrate of the present invention.

FIG. 1 schematically shows an example of a SiC composite substrate of the present invention. As shown in FIG. 1, a SiC composite substrate 10 includes a biaxially-oriented SiC layer 12 and a SiC polycrystalline layer 14. The biaxially-oriented SiC layer 12 is a layer in which SiC is oriented in both a c-axis direction and an a-axis direction. The SiC polycrystalline layer 14 is provided on one surface of the biaxially-oriented SiC layer 12. A joint interface of the biaxially-oriented SiC layer 12 and the SiC polycrystalline layer 14 has an uneven shape, which has an amount of unevenness of 1 to 200 µm. Thus, in the SiC composite substrate 10 including the biaxially-oriented SiC layer 12 and the SiC polycrystalline layer 14, a joint interface of the layers having a predetermined uneven shape makes it possible to have the SiC composite substrate less likely to cause delamination, breaking and cracking, even if subjected to machining such as grinding and polishing.

That is, as described in the above Patent Literatures 1 and 2, in a conventional SiC composite substrate obtained by joining a SiC single-crystalline substrate and a SiC polycrystalline substrate to each other, detachment of a joined surface (delamination), breaking and cracking may occur under the influence of a residual stress caused by the polishing of the surface of the single-crystalline SiC substrate. The SiC composite substrate 10 of the present invention can desirably solve these defects. This is considered to be because a high joint strength is achieved at the joint interface of the biaxially-oriented SiC layer 12 and the SiC polycrystalline layer 14 by the uneven shape satisfying the amount of unevenness. That is, the delamination (the detachment of the joined surface), breaking and cracking of the substrate, which may occur under the influence of the residual stress, are considered to be suppressed by the high joint strength provided by the uneven shape. As a result, the present invention can provide the SiC composite substrate that is less susceptible to delamination, breaking and cracking, even if subjected to machining such as grinding and polishing. Therefore, the SiC composite substrate 10 according to the present invention can be said to be extremely advantageous in that the SiC composite substrate is easily subjected to machining such as grinding and polishing when a semiconductor device is produced.

The biaxially-oriented SiC layer 12 is a layer in which SiC is oriented in both the c-axis direction and the a-axis direction, and may include both a polycrystalline layer containing a grain boundary and a single-crystalline layer containing no grain boundary. That is, the biaxially-oriented SiC layer 12 may be single crystalline, or polycrystalline as long as SiC is oriented in two axial directions of the c-axis direction and the a-axis direction. Alternatively, the biaxially-oriented SiC layer 12 may be a mosaic crystalline layer including a collection of crystals oriented so as to be slightly different in a c-axis direction, an a-axis direction, or both the directions without having a clear grain boundary.

The biaxially-oriented SiC layer 12 preferably has a defect density of $1.0 \times 10^{1}/cm^{2}$ or less, more preferably $1.0 \times 10^{0}/cm^{2}$ or less, and still more preferably $1.0 \times 10^{-1}/cm^{2}$ or less. The defect density is preferably lower, whereby the lower limit thereof may be 0 without particular limitation, but is typically $1.0 \times 10^{0}/cm^{2}$ or more. The defect includes threading screw dislocation (TSD), basal plane dislocation (BPD), and micropipe (MP).

The SiC polycrystalline layer 14 is provided on one surface of the biaxially-oriented SiC layer 12. The SiC polycrystalline layer 14 merely needs to be composed of a SiC polycrystalline body, and may be composed of a non-oriented polycrystalline body or an oriented polycrystalline body. That is, the SiC polycrystalline layer 14 may have orientation inferior to that of the biaxially-oriented SiC layer 12. This is because the SiC composite substrate 10 is assumed to exclusively use high orientation of the biaxially-oriented SiC layer 12, and the SiC polycrystalline layer 14 suffices to serve as a support for the biaxially-oriented SiC layer 12. Therefore, as compared with a substrate consisting of the biaxially-oriented SiC layer 12, the SiC composite substrate 10 can be more inexpensively manufactured or provided.

Figure 5:
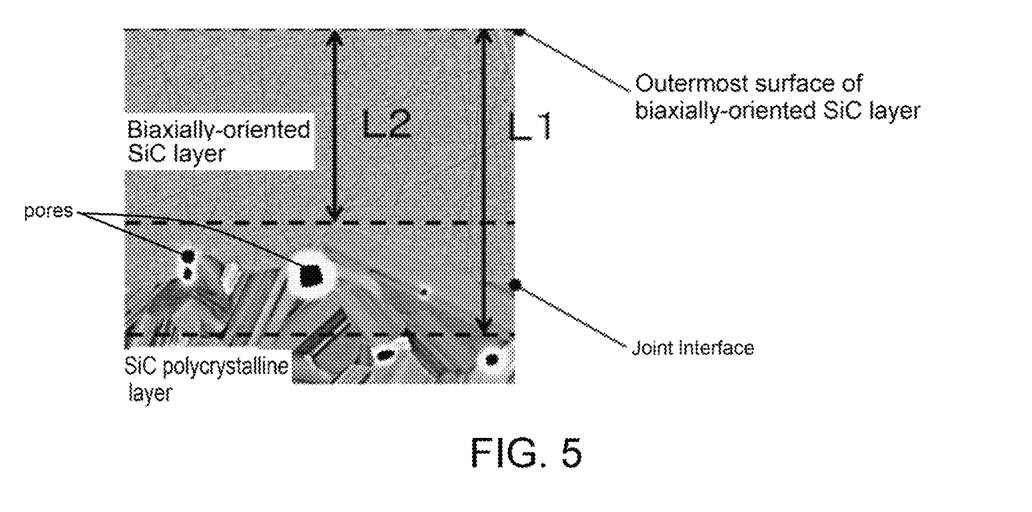
FIG. 5 is an enlarged cross-sectional SEM image shown in FIG. 4, and reference symbols for describing a method for measuring an amount of unevenness are added.

The joint interface of the biaxially-oriented SiC layer 12 and the SiC polycrystalline layer 14 has an uneven shape (not shown). The amount of unevenness of the uneven shape is 1 to 200 µm, preferably 1 to 180 µm, more preferably 2 to 160 µm, still more preferably 10 to 160 µm, and particularly preferably 60 to 160 µm. However, from the viewpoint of a reduction in the defect density, the amount of unevenness is preferably 1 to 110 µm, and more preferably 10 to 110 µm. The uneven shape of the amount of unevenness provides a sufficient joint strength at the joint interface of the biaxially-oriented SiC layer 12 and the SiC polycrystalline layer 14 to contribute to the suppression of the delamination, breaking and cracking of the substrate without hindering the uniform growth of the biaxially-oriented SiC layer 12, whereby the warpage of the SiC composite substrate 10 accompanying non-uniform growth can be prevented. Herein, the amount of unevenness of the uneven shape is determined in the following procedure. 1) The polished cross-section of the SiC composite substrate 10 is observed by SEM, and a reflection electron image of each of 10 fields of view (size of one field of view: 178 µm×256 µm) at any site including the joint interface of the biaxially-oriented SiC layer 12 and the SiC polycrystalline layer 14 is taken at 500× magnification. 2) As shown in FIG. 5, maximum and minimum values L1 and L2 of a distance between the outermost surface of the biaxially-oriented SiC layer 12 and the joint interface are measured, to calculate a difference ΔL of the maximum and minimum values L1 and L2. 3) The average value of the differences ΔL of 10 fields of view is calculated as the amount of unevenness of the joint interface of the biaxially-oriented SiC layer 12 and the SiC polycrystalline layer 14.

It is preferable that the joint interface of the biaxially-oriented SiC layer 12 and the SiC polycrystalline layer 14 has pores. The pores preferably have a pore diameter smaller than the amount of unevenness of the uneven shape, but is not necessarily limited. From the viewpoint of a reduction in the defect density, the pores preferably have a pore diameter of 1 to 70 µm, more preferably 5 to 70 µm, and still more preferably 50 to 65 µm. Thus, if the joint interface of the biaxially-oriented SiC layer 12 and the SiC polycrystalline layer 14 has the fine pores, a stress applied to the joint interface when the SiC composite substrate 10 is polished can be relieved without reducing the joint strength at the joint interface. As a result, the SiC composite substrate 10 can be further less likely to cause delamination, breaking and cracking. Herein, the pore diameter is determined in the following procedure. A reflection electron image of each of 10 fields of view (size of one field of view: 178 µm×256 µm) including the biaxially-oriented SiC layer 12 and the SiC polycrystalline layer 14 is taken at 500× magnification. The lengths of the longest sides of the pores present within 2 µm from the joint interface of the biaxially-oriented SiC layer 12 and the SiC polycrystalline layer 14 are measured. The pore diameter is a numerical value obtained by increasing the average value of the lengths of the longest sides of the pores of 10 fields of view by half.

Composite Substrate for Semiconductor Device

Figure 2:
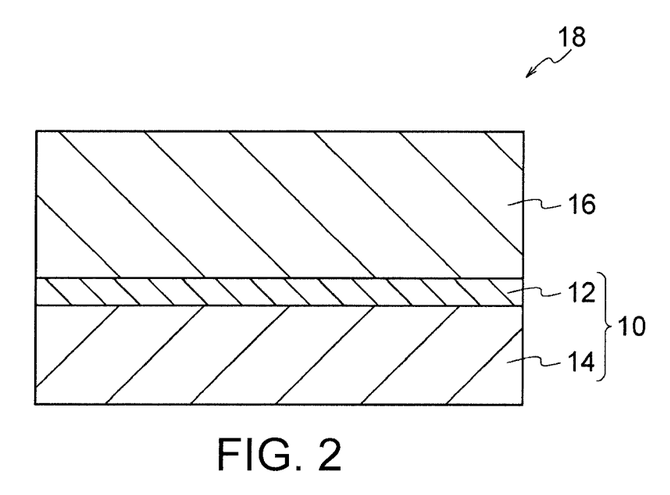
FIG. 2 is a schematic cross-sectional view showing an example of a composite substrate for a semiconductor device of the present invention.

The SiC composite substrate of the present invention is preferably incorporated in a composite substrate for a semiconductor device. Therefore, as shown in FIG. 2, a preferable aspect of the present invention provides a composite substrate 18 for a semiconductor device including the SiC composite substrate 10 and a functional layer 16 for a semiconductor device provided on the biaxially-oriented SiC layer 12 of the SiC composite substrate 10. Examples of the semiconductor device include a Schottky barrier diode (SBD), IGBT, and MOSFET. The structures and producing methods of the functional layer 16 for a semiconductor device and composite substrate 18 for a semiconductor device to be employed may be known according to the kind of the semiconductor device to be employed, and are not particularly limited.

Method for Manufacturing SiC Composite Substrate

The SiC composite substrate of the present invention can be manufactured by various manufacturing methods. Specific details are as follows.

A method for producing the SiC composite substrate is not particularly limited. For example, a biaxially-oriented SiC precursor layer is formed on a SiC single-crystalline substrate having a surface in which unevenness have been previously formed, and then subjected to a heat treatment, whereby a part of the biaxially-oriented SiC precursor layer on the interface side with the single crystal may be formed by crystal grow as the biaxially-oriented SiC layer with the SiC single crystal as a seed crystal. Alternatively, on a SiC single-crystalline substrate, a biaxially-oriented SiC precursor layer is formed, or a biaxially-oriented SiC precursor green body is laminated, and then subjected to a heat treatment, whereby a part of the biaxially-oriented SiC precursor layer or green body on the interface side with the single crystal may be formed by crystal grow as the biaxially-oriented SiC layer with the SiC single crystal as a seed crystal, thereby forming unevenness. In any of the methods, a portion that has not been formed by crystal grow as the biaxially-oriented SiC layer remains as the SiC polycrystalline layer in the biaxially-oriented SiC precursor layer or green body. A method for previously forming unevenness in a SiC single-crystalline substrate is not particularly limited, and for example, known techniques such as chemical etching, thermal etching, plasma etching, blast, and laser machining can be employed. Even when the biaxially-oriented SiC precursor layer is formed on the SiC single-crystalline substrate having a surface in which unevenness have been previously formed, the amount of unevenness may be further increased by a heat treatment after the film formation.

Then, the SiC single-crystalline layer is removed by grinding or the like, or the SiC single-crystalline layer and the biaxially-oriented SiC layer are separated at the interface in a laser process or the like, whereby the SiC composite substrate can be produced. For example, Patent Literature 3 (JP6429715B) discloses a method for separating a wafer using a pulse laser as a laser process.

The SiC composite substrate can also be produced by bonding separately produced polycrystalline SiC to a SiC single crystal through direct joining, and then subjecting the bonded body to a heat treatment, to form the biaxially-oriented SiC layer by crystal grow with the SiC single crystal as a seed crystal, thereby forming unevenness in the joint interface of the biaxially-oriented SiC layer and the SiC polycrystalline layer. The direct joining method is not particularly limited, and for example, it may be performed by a heat treatment at a desired temperature in a state where surfaces are washed with acetone and ion exchange water and the like, and the surfaces to be joined are stacked. This heat treatment may be performed after previous activation by a hydrophilic or hydrophobic treatment, or during pressurization using hot press or the like in order to further improve adhesion.

A method for forming the biaxially-oriented SiC precursor layer on the SiC single-crystalline substrate is not particularly limited as long as unevenness are formed in the joint interface of the biaxially-oriented SiC layer and the SiC polycrystalline layer after the film formation or the heat treatment, and known techniques can be employed. For example, by using solid phase film formation methods such as an AD (aerosol deposition) method and an HPPD (hypersonic plasma particle deposition) method, gas phase film forming methods such as a sputtering method, a vapor deposition method, a sublimation method, and various CVD (chemical vapor phase epitaxy) methods, or liquid phase film forming methods such as a solution growth method, the biaxially-oriented SiC precursor layer can be directly formed on the SiC single-crystalline substrate. As the CVD method, for example, a heat CVD method, a plasma CVD method, a mist CVD method, an MO (organic metal) CVD method and the like can be used. A method can also be used, in which the polycrystalline body previously produced by the sublimation method, the various CVD methods, and sintering and the like is used as the biaxially-oriented SiC precursor layer, and the polycrystalline body is placed on the SiC single-crystalline substrate. Alternatively, the method may be a technique in which the green body made of the biaxially-oriented SiC precursor is previously produced, and the green body is placed on the SiC single-crystalline substrate. Such a biaxially-oriented SiC precursor layer may be a tape formed body produced by tape forming, may be a green compact produced by pressure forming such as uniaxial press, or may be obtained by laminating the SiC polycrystalline body on the tape formed body or the green compact.

It is known that when the various CVD methods, the sublimation method, the solution growth method and the like are used in the technique of directly forming the biaxially-oriented SiC precursor layer on the SiC single-crystalline substrate, the biaxially-oriented SiC layer may be formed on the SiC substrate by epitaxial growth without being subjected to a heat treatment step to be described later. However, the biaxially-oriented SiC precursor layer is not in an oriented state during the production, that is, amorphous or non-oriented polycrystalline. The rearrangement of crystals is preferably produced with SiC as a seed crystal during the heat treatment step. This makes it possible to effectively reduce crystal defects reaching the surface of the biaxially-oriented SiC layer. Although the reason is not clear, this is considered to be because the crystal defects occurring in the lower part of the biaxially-oriented SiC layer are likely to annihilate each other. Therefore, it is preferable to select a condition in which the biaxially-oriented SiC layer is not formed by epitaxial growth in the formation step of the biaxially-oriented SiC precursor layer when the various CVD methods, the sublimation method, the solution growth method and the like are used.

However, preferred is a technique of directly forming the biaxially-oriented SiC precursor layer on the SiC single-crystalline substrate according to the aerosol deposition (AD) method, the various heat CVD methods and the like, or a technique of placing the polycrystalline body separately produced by the sublimation method, the various CVD methods, and sintering and the like on the SiC single-crystalline substrate. The use of these methods makes it possible to form the dense biaxially-oriented SiC precursor layer in a relatively short time, which easily form the biaxially-oriented SiC layer by epitaxial growth with the SiC substrate as the seed crystal during the heat treatment. In particular, the AD method has a relatively fast film formation rate without requiring a high-vacuum process, which is preferable also in view of manufacturing cost. In the technique of using the previously produced polycrystalline body as the biaxially-oriented SiC precursor layer, in order to improve adhesion between the polycrystalline body and the SiC single-crystalline substrate, devices such as sufficient smoothness of the surface of the polycrystalline body are required. For this reason, the technique of directly forming the biaxially-oriented SiC precursor layer is preferable in the viewpoint of cost. A technique of placing the previously produced green body on SiC is also preferable as a simple technique, but the biaxially-oriented SiC precursor layer is composed of powders, which requires a densification process for sintering in the heat treatment step to be described later. In any of the techniques, known conditions can be used, but a method for directly forming the biaxially-oriented SiC precursor layer on the SiC single-crystalline substrate according to the AD method or the heat CVD method, and a technique of placing the previously produced green body on the SiC single-crystalline substrate will be described later.

Figure 3:
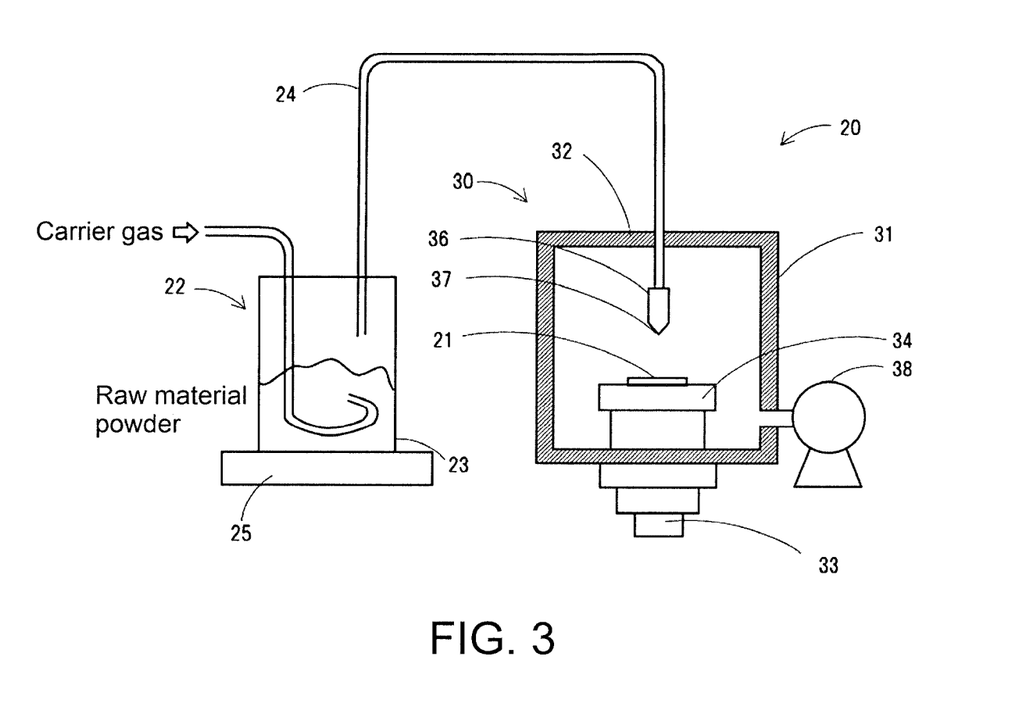
FIG. 3 is a schematic cross-sectional view showing the configuration of an aerosol deposition (AD) film formation apparatus.

The AD method is a technique of mixing fine particles or raw materials of the fine particles with a gas to form an aerosol, injecting the aerosol at a high speed from a nozzle so that the aerosol collides with a substrate, to form a coating, and is characterized in that the AD method can form a densified coating at normal temperature. FIG. 3 shows an example of a film formation apparatus (aerosol deposition (AD) apparatus) used in the AD method. A film formation apparatus 20 shown in FIG. 3 is configured as an apparatus used for the AD method for injecting a raw material powder onto a substrate under a pressure lower than an atmospheric pressure. The film formation apparatus 20 includes an aerosol generating part 22 for generating an aerosol of a raw material powder containing raw material components and a film forming part 30 for injecting the raw material powder onto a SiC single-crystalline substrate 21 to form a film containing the raw material components. The aerosol generating part 22 includes an aerosol generating chamber 23 for accommodating the raw material powder and generating an aerosol upon receiving the supply of a carrier gas from a gas cylinder (not shown), a raw material supply pipe 24 for supplying the generated aerosol to the film forming part 30, and a vibrator 25 for vibrating the aerosol generating chamber 23 and the aerosol present therein at a frequency of 10 to 100 Hz. The film forming part 30 includes a film forming chamber 32 where the aerosol is injected onto the SiC single-crystalline substrate 21, a substrate holder 34 which is provided inside the film forming chamber 32 to fix the SiC single-crystalline substrate 21, and an X-Y stage 33 for moving the substrate holder 34 in the X axis-Y axis direction. The film forming part 30 includes an injection nozzle 36 having a slit 37 formed at the tip for injecting the aerosol onto the SiC single-crystalline substrate 21, and a vacuum pump 38 for reducing the pressure of the film forming chamber 32.

In the AD method, it is known that pores occur in a film depending on film formation conditions, or the film becomes a green compact. For example, the form of an AD film is apt to be influenced by the collision speed of a raw material powder to a substrate, the particle size of the raw material powder, the aggregational state of the raw material powder in an aerosol, and an amount to be injected per unit time and the like. The collision speed of the raw material powder to the substrate is influenced by a difference in pressure between the film formation chamber and the injection nozzle, the opening area of the injection nozzle and the like. For this reason, in order to control the number of the pores in the biaxially-oriented SiC precursor layer, it is necessary to appropriately control these factors.

The heat CVD method can be performed by using known techniques such as a commercially available film formation apparatus. A raw material gas is not particularly limited, and as a source of supply of Si, a silicon tetrachloride ($SiCl_4$) gas, a silane ($SiH_4$) gas and the like can be used, and as a source of supply of C, a methane ($CH_4$) gas, a propane ($C_3H_8$) gas and the like can be used. When Si is excessively present while a film is formed, Si which does not contribute to growth flocculates, and the film grows while involving the Si aggregate. A film formation temperature is preferably 1000 to 2200° C., more preferably 1100 to 2000° C., and still more preferably 1200 to 1900° C.

As described above, it is known that when the film is formed on the SiC single crystal using the heat CVD method, the biaxially-oriented SiC layer may be formed on the SiC substrate by the epitaxial growth. However, the biaxially-oriented SiC precursor layer is not in an oriented state during the production, that is, amorphous or non-oriented polycrystalline. The rearrangement of crystals is preferably produced with SiC as a seed crystal during the heat treatment step. It is known that the formation of an amorphous or polycrystalline layer on the SiC single crystal using the heat CVD method is influenced by a film formation temperature, gas flow rates of Si and C sources, a ratio thereof, and a film formation pressure and the like. The influence of the film formation temperature is large, and in the viewpoint of forming the amorphous or polycrystalline layer, the film formation temperature is preferably lower, more preferably lower than 1700° C., still more preferably 1500° C. or lower, and particularly preferably 1400° C. or lower. However, if the film formation temperature is too low, a film formation rate itself also decreases, whereby in the viewpoint of the film formation rate, the film formation temperature is preferably higher. The heat CVD method is known as a method for forming a dense film irrespective of an epitaxial film or a polycrystalline film. However, by controlling the ratio of the gas flow rates of the Si and C sources, and the film formation pressure, the pores can be formed in the film. For example, by increasing a Si/C ratio, which is the ratio of the Si source to the C source, the aggregate of Si is formed in the film, and the pores are formed by evaporation during the film formation and the heat treatment as the subsequent step. Meanwhile, by decreasing the Si/C ratio, the pores are formed in the SiC film. Therefore, in order to form the polycrystalline or amorphous biaxially-oriented SiC precursor layer containing the pores using the heat CVD method, it is necessary to appropriately control factors such as the film formation temperature, the Si/C ratio, and the total pressure.

When the previously produced green body is used as the biaxially-oriented SiC precursor layer, the raw material powder of the biaxially-oriented SiC precursor can be formed to produce the green body. For example, when press forming is used, the biaxially-oriented SiC precursor layer is a press-formed body. The press-formed body can be produced by press forming the raw material powder of the biaxially-oriented SiC precursor based on known techniques. For example, the raw material powder may be placed in a mold, and pressed at a pressure of preferably 100 to 400 $kgf/cm^2$, and more preferably 150 to 300 $kgf/cm^2$ to produce the press-formed body. The forming method is not particularly limited, and tape forming, extrusion, casting, a doctor blade method, and combinations thereof can be used other than the press forming. For example, it is preferable that when the tape forming is used, an additive such as a binder, a plasticizer, a dispersant, or a dispersion medium is appropriately added to the raw material powder to form a slurry, and the slurry is then shaped into a sheet by discharging the slurry through a narrow slit-like discharge opening. The thickness of the green body shaped into the sheet is not limited, and is preferably 5 to 500 μm in the viewpoint of handling. When a thick biaxially-oriented SiC precursor layer is required, a stacked body obtained by stacking a large number of sheet shaped bodies and having a desired thickness may be used.

Portions of these green bodies near the SiC single-crystalline substrate serve as the biaxially-oriented SiC layer during the subsequent heat treatment on the SiC single-crystalline substrate. As described above, it is necessary to sinter the green body in the heat treatment step to be described later in such a technique. After a step in which the green body is sintered, and the sintered body is integrated with the SiC single-crystalline substrate as the polycrystalline body, the biaxially-oriented SiC layer is preferably formed. When the green body does not go through the sintered state, the biaxially-oriented SiC layer may not be sufficiently formed by epitaxial growth with the SiC single crystal as the seed. For this reason, the green body may contain an additive such as a sintering aid in addition to SiC raw materials. However, the pores are also desired to be formed in the biaxially-oriented SiC layer, and it is desirable to select the additive and the heat treatment condition which make these compatible.

The biaxially-oriented SiC precursor layer may contain a component that controls the electrical properties of the biaxially-oriented SiC layer. For example, when an n-type biaxially-oriented SiC layer is formed, the biaxially-oriented SiC precursor layer may contain nitrogen. When a p-type biaxially-oriented SiC layer is formed, the biaxially-oriented SiC precursor layer may contain B and/or Al. In order to impart insulating properties to the biaxially-oriented SiC layer, the biaxially-oriented SiC precursor layer may contain nitrogen and at least any one of B and Al.

In the heat treatment step, the biaxially-oriented SiC layer is produced by subjecting a laminated body in which the biaxially-oriented SiC precursor layer is laminated or placed on the SiC single-crystalline layer to a heat treatment. A heat treating method is not particularly limited as long as the biaxially-oriented SiC layer is formed by epitaxial growth with the SiC single-crystalline substrate as the seed, and can be carried out in known heat-treating furnaces such as a tubular furnace and a hot plate. Not only the heat treatment at normal pressure (press less) but also a heat treatment under pressure such as hot press or HIP, and a combination of the heat treatment at normal pressure and the heat treatment under pressure can also be used. The atmosphere of the heat treatment can be selected from a vacuum, nitrogen, and an inactive gas atmosphere. A heat treatment temperature is preferably 1700 to 2700° C. By increasing the temperature, the crystals of the SiC polycrystalline body are likely to grow while being oriented in the c-axis and the a-axis with the SiC single crystal of the SiC single-crystalline layer as the seed crystal from the crystal growth surface of the SiC single-crystalline layer. Therefore, the heat treatment temperature is preferably 1700° C. or higher, more preferably 1850° C. or higher, still more preferably 2000° C. or higher, and particularly preferably 2200° C. or higher. Meanwhile, if the temperature is too high, a part of SiC may be lost by sublimation, or SiC may be plastic-deformed to cause defects such as warpage. Therefore, the heat treatment temperature is preferably 2700° C. or lower, and more preferably 2500° C. or lower. The heat treatment temperature and a retention time are related to the thickness of the biaxially-oriented SiC layer provided in the epitaxial growth, and can be appropriately adjusted.

It should be noted that when the previously produced green body is used for the biaxially-oriented SiC precursor layer, it is necessary to sinter the green body during the heat treatment. Pressureless firing at a high temperature, hot press, HIP, or a combination thereof is suitable. For example, when the hot press is used, a surface pressure is preferably 50 kgf/cm$^2$ or more, more preferably 100 kgf/cm$^2$ or more, and particularly preferably 200 kgf/cm$^2$ or more, and there is no particular upper limit thereof. A firing temperature is not also particularly limited as long as sintering and epitaxial growth occur, and is preferably 1700° C. or higher, more preferably 1800° C. or higher, still more preferably 2000° C. or higher, and particularly preferably 2200° C. or higher. An atmosphere during firing can be selected from a vacuum, nitrogen, an inactive gas atmosphere, or a mixed gas of nitrogen and an inactive gas. A SiC powder serving as a raw material may be any of α-SiC and β-SiC. The SiC powder is preferably composed of SiC particles having an average particle size of 0.01 to 5 μm. The average particle size refers to an average value obtained by observing a powder with a scanning electron microscope and measuring maximum diameters of 100 primary particles in a predetermined direction.

In the heat treatment step, the crystals in the biaxially-oriented SiC precursor layer grow while being oriented in the c-axis and the a-axis from the crystal growth surface of the SiC single-crystalline layer, whereby the biaxially-oriented SiC precursor layer gradually changes to the biaxially-oriented SiC layer from the crystal growth surface. The biaxially-oriented SiC layer thus produced has a defect density of $1 \times 10^1$/cm$^2$ or less. Thus, the reason why the defect density is remarkably low is considered as follows. First, a heat stress in the biaxially-oriented SiC layer is considered to be a cause of the occurrence of dislocation, and the biaxially-oriented SiC precursor layer has the pores, so that the heat stress when the biaxially-oriented SiC layer is formed is considered to be mitigated, which makes it possible to suppress the dislocation caused by the heat stress. Secondly, it is considered that the defects in the SiC single-crystalline layer also propagate in the biaxially-oriented SiC layer, but the propagating defects collide with the pores in the biaxially-oriented SiC precursor layer and disappear, or the annihilation of the defects, or the like occurs because the heat stress in the biaxially-oriented SiC layer is small, so that the number of the defects decreases.

The SiC composite substrate of the present invention is obtained by grinding and removing the seed crystal of the fired body thus obtained to expose the surface of the biaxially-oriented SiC layer. The surface of the exposed biaxially-oriented SiC layer is preferably polished by CMP (chemical mechanical polishing) and the like to smoothen the surface.

EXAMPLES

The present invention will be more specifically described by the following Examples.

Example 1

(1) Production of SiC Composite Substrate
(1a) Production of Biaxially-Oriented SiC Precursor Using a commercially available fine β-SiC powder as a raw material powder (volume basis D50: 0.7 μm), and a commercially available SiC single-crystalline substrate (n-type 4H—SiC, diameter: 50.8 mm (2 inches), Si surface, (0001) surface, off angle: 4°, thickness: 0.35 mm, no orientation flat) as a substrate, an AD film was formed on a SiC single-crystalline substrate by an aerosol deposition (AD) apparatus shown in FIG. 3.

AD film formation conditions were as follows. First, $N_2$ was used as a carrier gas, and a film was formed using a nozzle made of ceramic and having a slit having a long side of 5 mm and a short side of 0.4 mm. The scan conditions of the nozzle included repeated scan of movement of 55 mm in a travel direction perpendicular to the long side of the slit at the scanning speed of 0.5 mm/s, movement of 5 mm in the direction of the long side of the slit, movement of 55 mm in a backward direction perpendicular to the long side of the slit, and movement of 5 mm in an opposite direction to an initial position in the direction of the long side of the slit. When the nozzle was moved by 55 mm from the initial position in the direction of the long side of the slit, the nozzle was moved in an opposite direction to the movement direction, and returned to the initial position. This was taken as one cycle, and repeated for 1200 cycles. The thickness of an AD film thus formed was about 120 μm.

(1b) Heat Treatment of Biaxially-Oriented SiC Precursor Layer

The SiC substrate on which the AD film had been formed was removed from an AD apparatus, and annealed at 2300° C. in an argon atmosphere for 5 hours.

(1c) Grinding and Polishing

A single crystal part of the obtained SiC substrate was ground and removed to expose the surface of a biaxially-oriented SiC layer 12. The exposed surface was polished by using a diamond abrasive grain, and then subjected to CMP (chemical mechanical polishing) finishing. Thus, a SiC composite substrate 10 was obtained. At this time, the delamination, breaking and cracking of the substrate due to grinding and polishing operations did not occur, and warpage did not occur, either.

(2) Evaluations

The SiC composite substrate 10 thus obtained was subjected to the following various evaluations.

<Cross-Section Observation>

Figure 4:
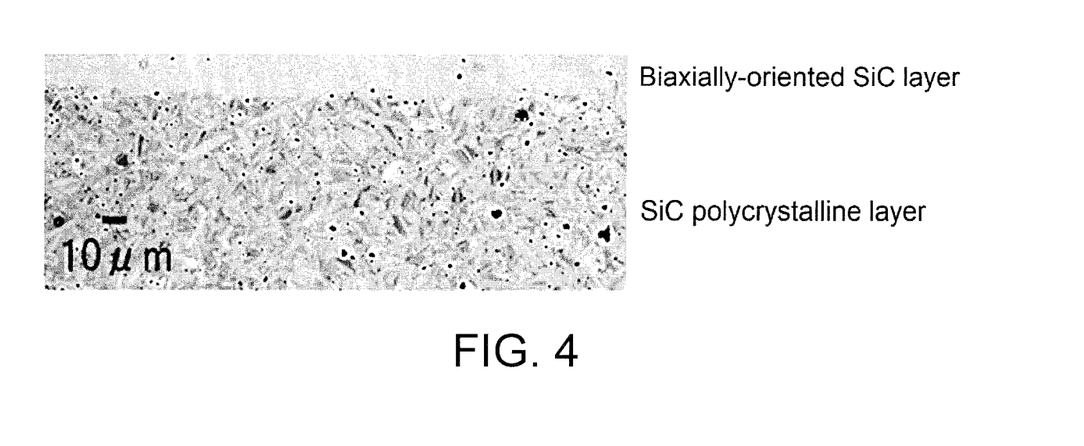
FIG. 4 is a cross-sectional SEM image of the SiC composite substrate produced in Example 1.

The cross-section of a central part of the SiC composite substrate 10 was subjected to mirror polishing using a diamond abrasive grain, and then subjected to CMP (chemical mechanical polishing) finishing. The obtained cross-section was taken by a scanning electron microscope (SU-5000 manufactured by Hitachi High-Technologies Corporation). At this time, as shown in FIG. 4, the biaxially-oriented SiC layer 12 could be easily discriminated from the SiC polycrystalline layer 14 and the joint interface according to a channeling contrast difference due to a difference in a crystal orientation.

<Amount of Unevenness of Joint Interface>

In the above cross-section observation, reflection electron images of 10 fields of view (size of one field of view: 178 μm×256 μm) including the biaxially-oriented SiC layer 12 and the SiC polycrystalline layer 14 were taken at 500× magnification. As shown in FIG. 5, maximum and minimum values L1 and L2 of a distance between the outermost surface of the biaxially-oriented SiC layer 12 and the joint interface were measured, to calculate a difference ΔL of the maximum and minimum values L1 and L2. Next, the average value of the differences ΔL of 10 fields of view was calculated as the amount of unevenness of the joint interface of the biaxially-oriented SiC layer 12 and the SiC polycrystalline layer 14. The results were shown in Table 1.

<Pore Diameter Near Joint Interface>

In the same reflection electron images (500× magnification) of 10 fields of view (size of one field of view: 178 μm×256 μm) as those during the measurement of the amount of unevenness described above, the lengths of the longest sides of the pores present in a region within ±2 μm in a thickness direction from the joint interface of the biaxially-oriented SiC layer 12 and the SiC polycrystalline layer 14 were measured. A numerical value obtained by increasing the average value of the lengths of the longest sides of the pores of 10 fields of view by half was employed as a pore diameter. The results were shown in Table 1.

<Defect Density of Biaxially-Oriented SiC Layer>

The SiC composite substrate 10 produced in the above (1) was used as an evaluation sample. The evaluation sample was placed together with a KOH crystal in a crucible made of nickel, and subjected to an etching treatment in an electric furnace at 500° C. for 10 minutes. The evaluation sample subjected to the etching treatment was washed, and the surface of the evaluation sample was observed with an optical microscope to count the number of pits. Specifically, any site of the surface of the evaluation sample was taken for 100 fields of view of 2.3 mm in height and 3.6 mm in width at 50× magnification to count the total number of pits. The counted total number of pits was divided by the total area of 8.05 cm² to calculate a defect density. The results were shown in Table 1.

<Biaxial Orientation>

When the inverse pole figure mapping of the surface (plate surface) of the biaxially-oriented SiC layer 12 or a cross-section orthogonal to the plate surface was measured using an electron back scatter diffraction patterns (EBSD) method, an inclination angle distribution had an inclination angle of 0.01° or less in both an approximately normal direction and an approximately plate surface direction, so that the SiC layer 12 was determined to be biaxially-oriented.

Example 2

A SiC composite substrate 10 was produced and evaluated in the same manner as in Example 1 except that the heat treatment temperature in the above (1b) was set to 2250° C. The results were shown in Table 1.

Example 3

A SiC composite substrate 10 was produced and evaluated in the same manner as in Example 1 except that the heat treatment temperature in the above (1b) was set to 2150° C. The results were shown in Table 1.

Example 4

A SiC composite substrate 10 was produced and evaluated in the same manner as in Example 1 except that the heat treatment temperature in the above (1b) was set to 2400° C. The results were shown in Table 1.

Example 5

A SiC composite substrate 10 was produced and evaluated in the same manner as in Example 1 except that the heat treatment temperature in the above (1b) was set to 2450° C. The results were shown in Table 1.

Example 6

A SiC composite substrate 10 was produced and evaluated in the same manner as in Example 1 except that a biaxially-oriented SiC precursor layer was formed by using a heat CVD method in place of the above (1a) and (1b) related to the AD method, and subjected to the subsequent heat treatment as follows. The results were shown in Table 1.
(Formation of Biaxially-Oriented SiC Precursor Layer by Heat CVD Method and Subsequent Heat Treatment)

Using a silicon tetrachloride ($SiCl_4$) gas and a methane ($CH_4$) gas as a raw material gas, a biaxially-oriented SiC precursor layer was formed at a thickness of about 400 μm under conditions of a furnace pressure of 7 kPa, a reaction temperature of 1360° C., and a $SiCl_4/CH_4$ ratio of 1.0 for a reaction time of 6 hours. The biaxially-oriented SiC precursor/SiC single crystal was subjected to a heat treatment at 2500° C. for 5 hours, to produce a biaxially-oriented SiC layer 12.

Example 7 (Comparative)

Figure 6:
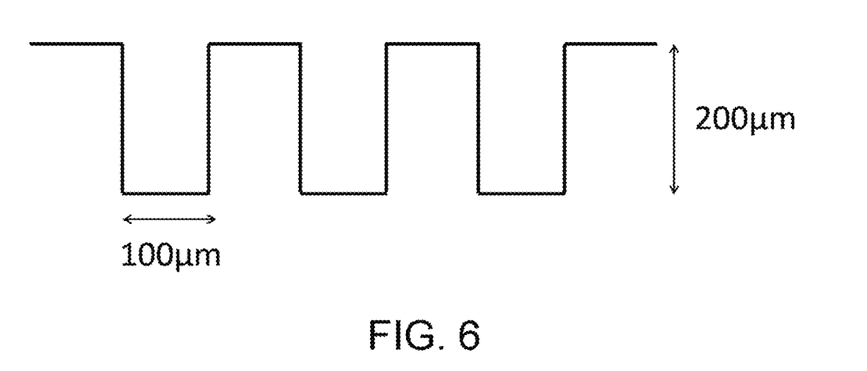
FIG. 6 is a schematic cross-sectional view showing an uneven shape (groove processed pattern) applied to a single-crystalline SiC substrate in Example 7 (Comparative).

A SiC composite substrate 10 was produced and evaluated in the same manner as in Example 6 except that a groove processed pattern having an uneven shape as shown in FIG. 6 was previously applied to a commercially available single-crystalline SiC substrate (n-type 4H—SiC, diameter: 50.8 mm (2 inches), Si surface, (0001) surface, off angle: 4°) in the above (1b). The results were shown in Table 1.

whereby the joint strength of the biaxially-oriented SiC layer 12 and the SiC polycrystalline layer 14 is improved, and a stress during machining is moderately relieved.

From the viewpoint of the defect density, when the amount of unevenness of the joint interface of the biaxially-oriented SiC layer 12 and the SiC polycrystalline layer 14 was less than 150 μm, the defect density decreased as the amount of unevenness increased. Although the details of the mechanism are not clear, it is presumed that the seed crystal used in the manufacturing method of the present aspect initially provides a crystal growth layer in an island form on the crystal growth surface, and the growth of the crystal growth layer then proceeds in an in-plane direction (for example, the direction of an a axis). Therefore, it is considered that as the amount of unevenness is greater, threading defects are also bent in the in-plane direction in association with the crystal growth in the in-plane direction, and defects do not propagate in a thickness direction. Meanwhile, it is considered that when the amount of unevenness is as excessive as 150 μm or more, a strain occurs near the interface of the biaxially-oriented SiC layer 12 and the SiC polycrystalline layer 14, which causes new defects to occur. It is considered that if the pore diameter is less than 70 μm, a heat stress between the biaxially-oriented SiC layer 12 and the SiC polycrystalline layer 14 is moderately relieved as the pore diameter is greater, which provides a decreased defect density. Meanwhile, it is considered that if the pore diameter is 70 μm or more, local stress concentration occurs in the insufficient junction site of the biaxially-oriented SiC layer 12 and the SiC polycrystalline layer 14, which causes an increased defect density.

What is claimed is:
1. A SiC composite substrate comprising:
    a biaxially-oriented SiC layer in which SiC is oriented in both a c-axis direction and an a-axis direction; and
    a SiC polycrystalline layer provided on one surface of the biaxially-oriented SiC layer,

TABLE 1

| | Joint interface of biaxially-oriented SiC layer and SiC polycrystalline layer | | Results of observation of SiC composite substrate | | |
|---|---|---|---|---|---|
| | Amount of unevenness (μm) | Pore diameter (μm) | Biaxially-oriented SiC layer Defect density (/cm$^2$) | Occurrence of delamination, breaking and cracking due to grinding and polishing operations | Presence or absence of warpage of substrate |
| Ex. 1 | 11.2 | 9.5 | 3.1 × 10$^0$ | Absence | Absence |
| Ex. 2 | 3.1 | 2.6 | 4.6 × 10$^0$ | Absence | Absence |
| Ex. 3 | 2.2 | 1.9 | 8.7 × 10$^0$ | Absence | Absence |
| Ex. 4 | 62.5 | 51.0 | 1.9 × 10$^0$ | Absence | Absence |
| Ex. 5 | 101.3 | 61.2 | 1.1 × 10$^0$ | Absence | Absence |
| Ex. 6 | 150.2 | 78.1 | 1.2 × 10$^1$ | Absence | Absence |
| Ex. 7* | 205.3 | 100.4 | 4.8 × 10$^1$ | Absence | Presence |

*represents Comparative Example

From the above results, from the viewpoints of grinding and polishing properties, the amount of unevenness of the joint interface of the biaxially-oriented SiC layer 12 and the SiC polycrystalline layer 14 was less than 200 μm, whereby the SiC composite substrate could be machined without causing delamination, breaking, cracking, and warpage. Although the reason is not clear, this is considered to be because the amount of unevenness or the diameter of the pores in the joint interface is within a suitable range, wherein a warpage-free joint interface of the biaxially-oriented SiC layer and the SiC polycrystalline layer has an uneven shape, which has an amount of unevenness of 1 to 200 μm.

2. The SiC composite substrate according to claim 1, wherein the amount of unevenness is 1 to 180 μm.

3. The SiC composite substrate according to claim 1, wherein the amount of unevenness is 1 to 110 μm.

4. The SiC composite substrate according to claim 1, wherein the warpage-free joint interface has pores, which have a pore diameter smaller than the amount of unevenness.

5. The SiC composite substrate according to claim 1, wherein the biaxially-oriented SiC layer has a defect density of $1.0 \times 10^1/cm^2$ or less.

6. A composite substrate for a semiconductor device comprising:
   the SiC composite substrate according to claim 1; and
   a functional layer for a semiconductor device provided on the biaxially-oriented SiC layer of the SiC composite substrate.

* * * * *